US006580150B1

(12) United States Patent
Metzler

(10) Patent No.: US 6,580,150 B1
(45) Date of Patent: Jun. 17, 2003

(54) VERTICAL JUNCTION FIELD EFFECT SEMICONDUCTOR DIODES

(75) Inventor: Richard A. Metzler, Mission Viejo, CA (US)

(73) Assignee: VRAM Technologies, LLC, Costa Mesa, CA (US)

( * ) Notice: Subject to any disclaimer, the term of this patent is extended or adjusted under 35 U.S.C. 154(b) by 0 days.

(21) Appl. No.: 09/712,449

(22) Filed: Nov. 13, 2000

(51) Int. Cl.[7] .................. H01L 23/58; H01L 29/80; H01L 31/112
(52) U.S. Cl. .................. 257/594; 257/287; 257/653; 257/910
(58) Field of Search ................... 257/287, 594, 257/653, 910; 438/328, 237, 965

(56) References Cited

U.S. PATENT DOCUMENTS

| | | | |
|---|---|---|---|
| 2,444,255 A | 6/1948 | Hewlett | 175/366 |
| 3,295,030 A | 12/1966 | Allison | 317/235 |
| 3,407,343 A | 10/1968 | Fang | |
| 3,427,708 A | 2/1969 | Schutze et al. | 29/580 |
| 3,458,798 A | 7/1969 | Fang et al. | |
| 3,566,215 A | 2/1971 | Heywang | 317/235 |
| 3,586,925 A | 6/1971 | Collard | |
| 3,617,824 A | 11/1971 | Shinoda | |
| 3,619,737 A | 11/1971 | Chiu | 317/235 |
| 3,749,987 A | 7/1973 | Anantha | |
| 3,769,109 A | 10/1973 | MacRae et al. | 156/3 |
| 3,864,819 A | 2/1975 | Ying | 29/583 |
| 3,935,586 A | 1/1976 | Landheer et al. | |
| 3,943,547 A | 3/1976 | Nagano et al. | 357/38 |
| 3,988,765 A | 10/1976 | Pikor | 357/52 |
| 4,019,248 A | 4/1977 | Black | 29/583 |
| 4,045,250 A | 8/1977 | Dingwall | 148/1.5 |
| 4,099,260 A | 7/1978 | Lynes et al. | |
| 4,104,086 A | 8/1978 | Bondur et al. | 148/1.5 |
| 4,138,280 A | 2/1979 | Rodov | 148/186 |
| 4,139,880 A | 2/1979 | Ulmer et al. | |
| 4,139,935 A | 2/1979 | Bertin et al. | |
| 4,140,560 A | 2/1979 | Rodov | 148/188 |
| 4,153,904 A | 5/1979 | Tasch, Jr. et al. | 357/13 |
| 4,246,502 A | 1/1981 | Kubinec | |
| 4,318,751 A | 3/1982 | Horng | 148/1.5 |
| 4,330,384 A | 5/1982 | Okudaira et al. | 204/192 |
| 4,340,900 A | 7/1982 | Goronkin | 357/56 |
| 4,372,034 A | 2/1983 | Bohr | 29/577 |
| 4,403,396 A | 9/1983 | Stein | |
| 4,423,456 A | 12/1983 | Zaidenweber | |
| 4,508,579 A | 4/1985 | Goth et al. | |
| 4,533,988 A | 8/1985 | Daly et al. | |

(List continued on next page.)

FOREIGN PATENT DOCUMENTS

| | | |
|---|---|---|
| DE | 3219-888 A | 5/1982 |
| DE | 196 05 633 | 12/1996 |
| JP | 61156882 | 7/1986 |
| JP | 63205927 A | 8/1988 |
| JP | 63054762 | 9/1988 |
| JP | 405109883 A | 4/1993 |
| WO | WO 98/33218 | 7/1998 |

OTHER PUBLICATIONS

Han–Soo,Kim et al., "Breakdown Voltage Enhancement of the p–n Junction by Self–Aligned Double Diffusion Process Through a Tapered SiO$_2$ Implant Mask," IEEE Electronic Device Letters, vol. 16, No. 9, p. 405, 1995, New York, U.S.

(List continued on next page.)

Primary Examiner—Ngân V. Ngô
(74) Attorney, Agent, or Firm—Blakely, Sokoloff, Taylor & Zafman LLP

(57) ABSTRACT

Semiconductor diodes are diode connected vertical cylindrical field effect devices having one diode terminal as the common connection between a gate and a source/drain of the vertical cylindrical field effect devices. Methods of forming the diode connected vertical cylindrical field effect devices are disclosed.

39 Claims, 11 Drawing Sheets

U.S. PATENT DOCUMENTS

| | | | |
|---|---|---|---|
| 4,534,826 A | 8/1985 | Goth et al. ................. 156/643 |
| 4,579,626 A | 4/1986 | Wallace ...................... 156/651 |
| 4,586,075 A | 4/1986 | Schwenk et al. ............. 357/74 |
| H64 H | 5/1986 | Maleis |
| 4,638,551 A | 1/1987 | Einthoven .................... 29/571 |
| 4,666,556 A | 5/1987 | Fulton et al. ............... 156/643 |
| 4,672,736 A | 6/1987 | Westermeier ................ 29/569 |
| 4,672,738 A | 6/1987 | Stengl et al. ................. 29/576 |
| 4,680,601 A | 7/1987 | Mitlehner et al. |
| 4,739,386 A | 4/1988 | Tanizawa ..................... 357/34 |
| 4,742,377 A | 5/1988 | Einthoven ................... 357/15 |
| 4,745,395 A | 5/1988 | Robinson |
| 4,757,031 A | 7/1988 | Kuhnert et al. ............. 437/154 |
| 4,774,560 A | 9/1988 | Coe ............................ 357/52 |
| 4,777,580 A | 10/1988 | Bingham |
| 4,808,542 A | 2/1989 | Reichert et al. .............. 437/20 |
| 4,811,065 A | 3/1989 | Cogan |
| 4,822,601 A | 4/1989 | Goode et al. ................. 424/59 |
| 4,822,757 A | 4/1989 | Sadamori .................... 437/249 |
| 4,857,985 A | 8/1989 | Miller |
| 4,875,151 A | 10/1989 | Ellsworth et al. |
| 4,900,692 A | 2/1990 | Robinson ..................... 437/67 |
| 4,903,189 A | 2/1990 | Ngo et al. |
| 4,927,772 A | 5/1990 | Arthur et al. ................. 437/6 |
| 4,974,050 A | 11/1990 | Fuchs .......................... 357/50 |
| 5,038,266 A | 8/1991 | Callen et al. |
| 5,047,355 A | 9/1991 | Huber et al. |
| 5,801,509 A | 1/1992 | Kozaka et al. |
| 5,093,693 A | 3/1992 | Abbas et al. ................. 357/13 |
| 5,101,254 A | 3/1992 | Hamana |
| 5,109,256 A | 4/1992 | De Long |
| 5,132,749 A | 7/1992 | Nishibayashi et al. |
| 5,144,547 A | 9/1992 | Masamoto |
| 5,184,198 A | 2/1993 | Bartur |
| 5,225,376 A | 7/1993 | Feaver et al. ............... 437/228 |
| 5,258,640 A | 11/1993 | Hsieh et al. |
| 5,268,833 A | 12/1993 | Axer |
| 5,296,406 A | 3/1994 | Readdie et al. |
| 5,340,757 A | 8/1994 | Chantre et al. |
| 5,349,230 A | 9/1994 | Shigekane |
| 5,357,131 A | 10/1994 | Sunami et al. |
| 5,365,102 A | 11/1994 | Mehrotra et al. |
| 5,396,087 A | 3/1995 | Baliga |
| 5,426,325 A | 6/1995 | Chang et al. ................ 257/408 |
| 5,430,323 A | 7/1995 | Yamazaki et al. |
| 5,469,102 A | 11/1995 | Shou et al. |
| 5,469,103 A | 11/1995 | Shigekane |
| 5,475,245 A | 12/1995 | Kudo et al. |
| 5,475,252 A | 12/1995 | Merrill et al. |
| 5,506,421 A | 4/1996 | Palmour ....................... 257/77 |
| 5,510,641 A | 4/1996 | Yee et al. |
| 5,536,676 A | 7/1996 | Cheng et al. ................ 437/162 |
| 5,780,324 A | 7/1998 | Tokura et al. |
| 5,818,084 A | 10/1998 | Williams et al. |
| 5,825,079 A | 10/1998 | Metzler et al. |
| 5,886,383 A | 3/1999 | Kinzer |
| 5,907,181 A | 5/1999 | Han et al. .................... 257/630 |
| 6,002,574 A | 12/1999 | Metzler et al. .......... 361/301.4 |
| 6,160,306 A * | 12/2000 | Kim et al. ................... 257/653 |
| 6,186,408 B1 | 2/2001 | Rodov et al. ............... 238/268 |

OTHER PUBLICATIONS

Breakdown Voltage Enhancement of the p–n Junction by Self–Aligned Double Diffusion Process Through a Tapered SiO2 Implant Mask; Han–Soo Kim, Seong–Dong Kim, Min–Koo Han, Seok–Nam Yoon and Yearn–Ik Choi; Sep. 16, 1995 IEEE Electron Device Letters; pp. 405–407.

Silicon Processing For the VLSI Era, vol. 1, Processing Technology; Stanley Wolf and Richard N. Tauber; 1986; pp. 321–327.

K. Jano, M. Mitsui, J. Morita, M. Kasuga & A. Shimizu; Applacation of a Junction Field Effect Transistor Structure to a Low Loss Diode: Jpn. J. Appl. Phys. vol. 36, pp. 1487–1493; Mar. 1997.

* cited by examiner

VERTICAL JUNCTION FIELD EFFECT SEMICONDUCTOR DIODES

CROSS REFERENCE TO RELATED APPLICATION

This application is related to U.S. patent application Ser. No. 09/689,074 entitled "METHOD AND APPARATUS FOR PATTERNING FINE DIMENSIONS" filed by Richard A. Metzler on Oct. 12, 2000 and U.S. patent application Ser. No. 09/502,026 entitled "METHOD AND APPARATUS FOR CYLINDRICAL SEMICONDUCTOR DIODES" filed by Richard A. Metzler on Feb. 10, 2000.

BACKGROUND OF THE INVENTION

1. Field of the Invention

The present invention generally relates to semiconductor devices and fabrication of the same. The present invention more particularly relates to semiconductor diodes and their methods of fabrication.

2. Background Information

Semiconductor devices of various kinds are well known in the prior art. Because the present invention relates to semiconductor diodes and how they are fabricated, the focus of this section will be semiconductor diodes.

Semiconductor diodes are widely used in electronic circuits for various purposes. The primary purpose of such semiconductor diodes is to provide conduction of current in a forward direction in response to a forward voltage bias, and to block conduction of current in the reverse direction in response to a reverse voltage bias. This rectifying function is widely used in such circuits as power supplies of various kinds as well as in many other electronic circuits.

In typical semiconductor diodes, conduction in the forward direction is limited to leakage current values until the forward voltage bias reaches a characteristic value for the particular type of semiconductor device. By way of example, silicon pn junction diodes don't conduct significantly until the forward bias voltage is at least approximately 0.7 volts. Many silicon Schottky diodes, because of the characteristics of the Schottky barrier, can begin to conduct at lower voltages, such as 0.4 volts. Germanium pn junction diodes have a forward conduction voltage drop of approximately 0.3 volts at room temperature. However, the same are currently only rarely used, not only because of their incompatibility with silicon integrated circuit fabrication, but also even as a discrete device because of temperature sensitivity and other undesirable characteristics thereof.

In some applications, diodes are used not for their rectifying characteristics, but rather to be always forward biased so as to provide their characteristic forward conduction voltage drop. For instance, in integrated circuits, diodes or diode connected transistors are frequently used to provide a forward conduction voltage drop substantially equal to the base-emitter voltage of another transistor in the circuit. While certain embodiments of the present invention may find use in circuits of this general kind, such use is not a primary objective thereof.

In circuits which utilize the true rectifying characteristics of semiconductor diodes, the forward conduction voltage drop of the diode is usually a substantial disadvantage. By way of specific example, in a DC to DC step-down converter, a transformer is typically used wherein a semiconductor switch controlled by an appropriate controller is used to periodically connect and disconnect the primary of the transformer with a DC power source. The secondary voltage is connected to a converter output, either through a diode for its rectifying characteristics, or through another semiconductor switch. The controller varies either the duty cycle or the frequency of the primary connection to the power source as required to maintain the desired output voltage. If a semiconductor switch is used to connect the secondary to the output, the operation of this second switch is also controlled by the controller.

Use of a semiconductor switch to couple the secondary to the output has the advantage of a very low forward conduction voltage drop, though has the disadvantage of requiring careful control throughout the operating temperature range of the converter to maintain the efficiency of the energy transfer from primary to secondary. The use of a semiconductor diode for this purpose has the advantage of eliminating the need for control of a secondary switch, but has the disadvantage of imposing the forward conduction voltage drop of the semiconductor diode on the secondary circuit. This has at least two very substantial disadvantages. First, the forward conduction voltage drop of the semiconductor diode device can substantially reduce the efficiency of the converter. For instance, newer integrated circuits commonly used in computer systems are designed to operate using lower power supply voltages, such as 3.3 volts, 3 volts and 2.7 volts. In the case of a 3 volt power supply, the imposition of a 0.7 volt series voltage drop means that the converter is in effect operating into a 3.7 volt load, thereby limiting the efficiency of the converter to 81%, even before other circuit losses are considered.

Second, the efficiency loss described above represents a power loss in the diode, resulting in the heating thereof. This limits the power conversion capability of an integrated circuit converter, and in many applications requires the use of a discrete diode of adequate size, increasing the overall circuit size and cost.

Another commonly used circuit for AC to DC conversion is the full wave bridge rectifier usually coupled to the secondary winding of a transformer having the primary thereof driven by the AC power source. Here two diode voltage drops are imposed on the peak DC output, making the circuit particularly inefficient using conventional diodes, and increasing the heat generation of the circuit requiring dissipation through large discrete devices, heat dissipating structures, etc. depending on the DC power to be provided.

Therefore, it would be highly advantageous to have a semiconductor diode having a low forward conduction voltage drop for use as a rectifying element in circuits wherein the diode will be subjected to both forward and reverse bias voltages from time to time. While such a diode may find many applications in discrete form, it would be further desirable for such a diode to be compatible with integrated circuit fabrication techniques so that the same could be realized in integrated circuit form as part of a much larger integrated circuit. Further, while reverse current leakage is always undesirable and normally must be made up by additional forward conduction current, thereby decreasing circuit efficiency, reverse current leakage can have other and more substantial deleterious affects on some circuits. Accordingly it would also be desirable for such a semiconductor diode to further have a low reverse bias leakage current.

In many applications it is required that the diode be put across a coil such as a transformer. In these instances it is possible for a reverse voltage to be applied to the diode which will force it into reverse breakdown, specifically into a junction avalanche condition. This is particularly true in DC to DC converters which use a rapidly changing waveform to drive transformer coils which are connected across diode bridges. In these applications a specification requirement for "Avalanche Energy" capability is a parameter normally included in the data sheets. The avalanche energy capability of a diode is a significant factor for a designer of such circuits. The avalanche energy capability determines how much design margin a designer has when designing a semiconductor diode into a circuit. The larger the number of avalanche energy capability the more design flexibility a circuit designer has.

The avalanche energy capability is a measure of the diode's capability to absorb the energy from the coil, where energy $E=(\frac{1}{2})*I^2*L$, without destroying the diode. These requirements are typically on the order of tens of millijoules. A key factor in the ability of a diode to nondestructively dissipate this energy is the amount of junction area which dissipates the energy i.e., the area of the junction which actually conducts during avalanche. High avalanche energy capability of a semiconductor diode improves its utilization.

At the same time, it is desirable to lower the costs of semiconductor diodes by reducing their size and by improving their methods of fabrication.

BRIEF SUMMARY OF THE INVENTION

The present invention includes methods and apparatus as described in the claims. Briefly, semiconductor diodes having a low forward conduction voltage drop, a low reverse leakage current, a high voltage capability and avalanche energy capability, suitable for use in integrated circuits as well as for discrete devices are disclosed. The semiconductor diodes are diode configured vertical cylindrical junction field effect devices having one diode terminal as the common connection between the gate and the source/drain of the vertical cylindrical junction field effect devices. The method of manufacturing the vertical cylindrical junction field effect devices is disclosed. Various device terminations can be employed to complete the diode devices. Various embodiments are disclosed.

Other aspects and features of the present invention will become apparent to those ordinarily skilled in the art upon review of the following description of specific embodiments of the invention in conjunction with the accompanying claims and figures.

BRIEF DESCRIPTION OF THE FIGURES

The features and advantages of the present invention will become apparent from the following detailed description of the present invention in which:

FIGS. 4A–4I are cross-sectional views illustrating steps in another exemplary process for fabricating the diode connected vertical junction field effect device of the present invention.

Like reference numbers and designations in the drawings indicate like elements providing similar functionality.

DETAILED DESCRIPTION OF THE PRESENT INVENTION

Figure 1:
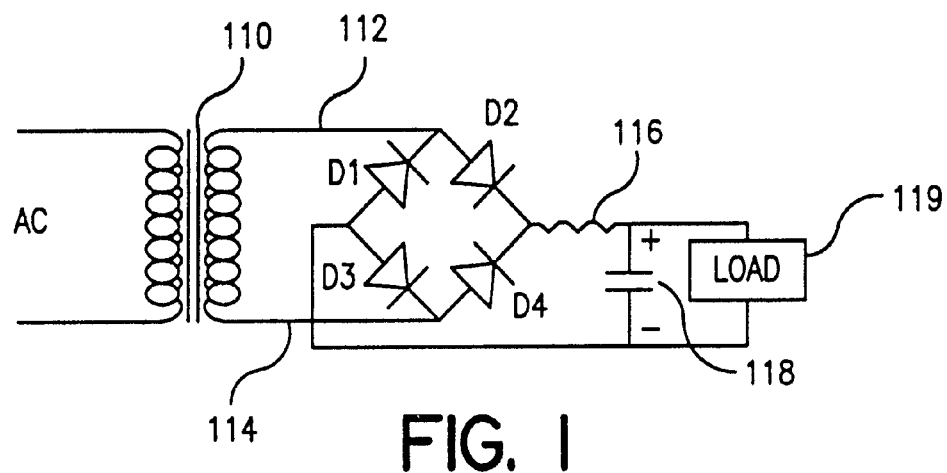
FIG. 1 is a circuit diagram for a well known AC to DC converter using a full wave bridge rectifier in which the present invention may be used.

First referring to FIG. 1, a circuit diagram for a well known AC to DC converter using a full wave bridge rectifier in which the present invention may be used may be seen. In such circuits, a transformer 110 is used to provide DC isolation between the primary and secondary circuits and frequently to provide an AC voltage step-up or step-down to the full wave bridge, comprised of diodes D1, D2, D3 and D4. When the secondary lead 112 is sufficiently positive with respect to secondary lead 114, diode D2 will conduct through resister 116 to charge or further charge capacitor 118 and to provide current to load 119, which current returns to lead 114 of the transformer through diode D3. Similarly, during the other half cycle of the AC input voltage, when the voltage on secondary lead 114 is sufficiently positive with respect to secondary lead 112, diode D4 will conduct to provide current through resistor 116 to charge capacitor 118 and to provide current to load 119, with the capacitor and load currents being returned to the secondary lead 112 through diode D1. Thus it may be seen that each time current is delivered from the full wave bridge of diodes D1 through D4 to the output of the bridge, two diode voltage drops are imposed in series with that output. Further, since any pair of diodes conduct only when the voltage across the secondary of the transformer 110 exceeds the voltage across capacitor 118 by two diode voltage drops, it is clear that current is delivered to the output of the bridge only during a fraction of the time, namely when the transformer secondary voltage is at or near a positive or negative peak.

The circuit of FIG. 1 is merely exemplary of the type of circuit in which the present invention is intended to be used. These circuits may be characterized as circuits wherein the diode will be subjected to both positive (forward) and negative (reverse) differential voltages across the two diode connections and the function of the diode is a rectifying function to provide a DC or rectified current output. This is to be distinguished from applications wherein the desired function of a diode is to provide a voltage reference responsive to the forward conduction voltage drop characteristic of the diode when conducting current, whether or not the diode will be subjected to negative differential voltages also when in use. These circuits may also be characterized as circuits wherein the diode or diodes will be subjected to both positive and negative differential voltages across the diode connections and the function of the diode or diodes is a power rectifying function to provide a DC or rectified current output of sufficient power level to power one or more circuits connected thereto. This is to be distinguished from applications wherein the desired function of the diode is to provide a signal-level current output which is used or processed in a subsequent circuit not powered by the DC or rectified current output of the diodes.

In many circuits of the type shown in FIG. 1, a linear voltage regulator may be used in the output in addition to smoothing capacitor 118. Further, resistor 116, which serves as a current limiting resistor, may be eliminated as a separate circuit component in favor of the secondary resistance of the transformer, as the transformer, in substantially all applications of interest, will be an actual discrete component of sufficient size to dissipate the power loss therein. Of particular importance to the present invention, however, are the diodes D1 through D4 themselves, as the power loss in these diodes in general serves no desired circuit function, but rather merely creates unwanted power dissipation and heat, requiring the use of larger diodes, whether in discrete form or integrated circuit form, and actually increases the size of the transformer required to provide this extra power output, e.g., the power required by the load plus the power dissipated by the diodes.

Figure 2A:
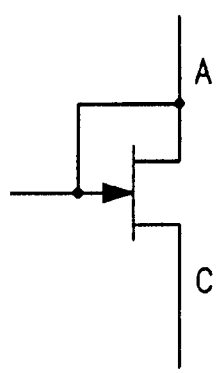
FIGS. 2A–2B are schematic diagrams of n-channel and p-channel junction field effect devices which are diode connected in accordance with the present invention.
Figure 2B:
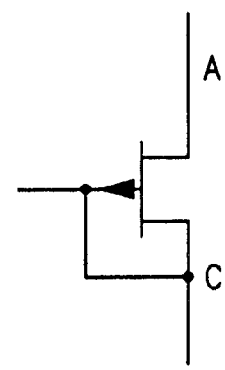
Figure 2C:
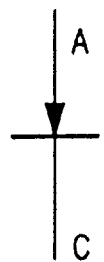
FIG. 2C is a schematic diagram of the equivalent circuit of the diode connected junction field effect devices of FIGS. 2A and 2B.

The present invention is directed to the realization of diodes and/or diode functions having low diode forward conduction voltage drops, low reverse current leakage, and high voltage capabilities for use primarily in such circuits and other circuits wherein the diodes are in fact subjected to forward and reverse bias in use. This is achieved in the present invention through the use of diode connected field effect devices, shown schematically in FIGS. 2A and 2B as n-channel and p-channel diode connected field effect devices, respectively. In accordance with the preferred embodiment of the invention, such devices are fabricated through the use of common gate and drain connections, typically a common conducting layer on the substrate, and more preferably through one or more special fabrication techniques which enhance the electrical characteristic of the resulting device. FIG. 2C illustrates the equivalent diode of the diode connected field effect devices of FIGS. 2A and 2B with the respective anode "A" and cathode "C" terminals.

The present invention implements a semiconductor diode by forming a vertical and cylindrical shaped junction field effect transistor (JFET) having a diode connected configuration a vertical and cylindrical shaped junction field effect transistor (JFET) having a diode connected configuration is referred to as a diode configured vertical junction field effect device (JFED). The diode configured vertical JFED provides a higher channel density and can be formed using a simpler manufacturing process. The higher channel density allows a semiconductor diode to be formed in an area of silicon approximately one third of that of prior semiconductor diodes having similar performance. The higher channel density provides a considerable cost and performance advantage.

In manufacturing the diode configured vertical JFED, the masking and manufacturing techniques described in U.S. patent application Ser. No. 09/689,074 entitled "METHOD AND APPARATUS FOR PATTERNING FINE DIMENSIONS" filed by Richard A. Metzler on Oct. 12, 2000 which is incorporated herein by reference can also be used to reduce the cost of masking and provide finer lines in the present invention than might otherwise be available.

A process for fabricating embodiments of the present invention are presented herein in relation to the cross-sectional views of FIGS. 3A–3F and FIGS. 4A–4I. The process forms the diode configured vertical junction field effect device (JFED). The diode configured vertical junction field effect device can be essentially thought of as a cylindrical and vertical junction field effect transistor being diode connected with common gate and drain connections. The diode configured vertical junction field effect device of the present invention may also be referred to as a vertical JFED diode. However, the present invention is not a traditional junction field effect transistor (JFET) because it operates differently and is formed by a different process.

Referring now to FIGS. 3A–3F, cross-sectional views of steps to an exemplary process for fabricating the diode connected vertical junction field effect device of the present invention are illustrated. The diode connected or diode configured vertical JFED is formed using cylindrical pedestals. FIGS. 3A–3F show only a portion of a wafer. It being understood that similar processing is performed across larger portions or an entire semiconductor wafer forming more diode configured vertical JFEDs than illustrated.

Figure 3A:
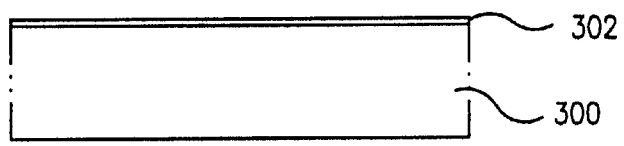
FIGS. 3A–3F are cross-sectional views illustrating steps in an exemplary process for fabricating the diode connected vertical junction field effect device of the present invention.

FIG. 3A shows a starting substrate 300 of a wafer. The substrate 300 can be silicon, gallium-arsenide (GaAs), germanium, silicon-carbide (SiC), or other known semiconductor substrate. In one embodiment, the substrate 300 is a silicon substrate having a silicon epitaxial layer therein. The silicon epitaxial layer is provided in order to form an increased reverse bias breakdown voltage for diode devices. In one embodiment, the silicon epitaxial layer has a resisitivity of approximately 1.1 ohm-cm and a thickness of approximately 3 um in order to achieve a reverse bias breakdown voltage of about forty-five volts. Epitaxial wafers having the silicon epitaxial layer can be purchased as starting material, or formed as part of the processing of the diode using well known standard epitaxial growth techniques.

In the case of an N-type silicon substrate, the lower or backside surface of the substrate 300 forms the cathode while a portion of the top surface of the substrate 300 is formed to be the anode. In the case of a P-type silicon substrate, the diode terminals are reversed and the lower or backside surface of the substrate 300 forms the anode while a portion of the top surface of the substrate 300 is formed to be the anode.

A thin oxide 302 is grown on the surface of the substrate 300 in order to randomize sheet implants which are to follow. The thin oxide 302 is typically one hundred fifty Angstroms (150 Å) in thickness. Both of the sheet implants that follow require no masking by a mask but rather are ions that are implanted over the entire wafer.

The first sheet implant is to provide a good ohmic contact for the Anode region of the vertical JFED diode. The first sheet implant is an Arsenic implant at about $3 \times 10^{15}$ atoms per $cm^2$ with an energy of 25 KeV. The second sheet implant is a Phosphorous implant at about $2.0 \times 10^{13}$ atoms per $cm^2$ implanted with an energy of 85 Kev. The second sheet implant sets the "threshold" or pinch off voltage of the vertical JFED diode similar to that of a JFET.

Figure 3B:
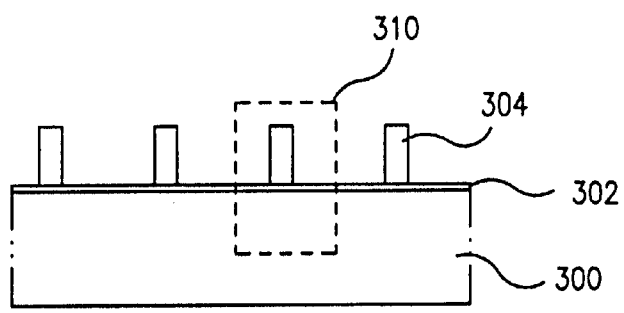

Referring now to FIG. 3B, completion of a first masking step is illustrated. Prior to the first masking step and etching, a layer of polysilicon is applied on top of the thin oxide 302 across the wafer. The polysilicon layer is then patterned using a mask and areas are etched away to form cylindrical shaped construction pedestals 304 on top of the thin oxide 302. The cylindrical shaped construction pedestals 304 are approximately 0.1 microns (um) high in one embodiment. The shape of the pedestals 304 can be any cylindrical shape, including but not limited to, circular, hexagonal, square, rectangular, as well as other sold shapes such as serpentine, etc. For ease of description herein, the cylindrical shape will be presumptively rectangular forming rectangular cylindrical pedestals or bars formed out of the polysilicon layer. FIG. 3B illustrates a cross-section of four of a plurality of rectangular cylindrical pedestals 304 that are formed across the silicon wafer. The dimensions of the rectangular cylindrical construction pedestals 304 in one embodiment are approximately 0.15 microns in width, approximately 0.1 microns in height, with a pitch of approximately 0.4 microns. It is understood that these dimensions can be altered in coordination with any adjustment in the implantation levels in order to provide similar device physics for a diode configured vertical JFED. Region 310 of silicon wafer is exploded into FIG. 3C in order to further detail the processing around each of the plurality of pedestals 304.

Figure 3C:
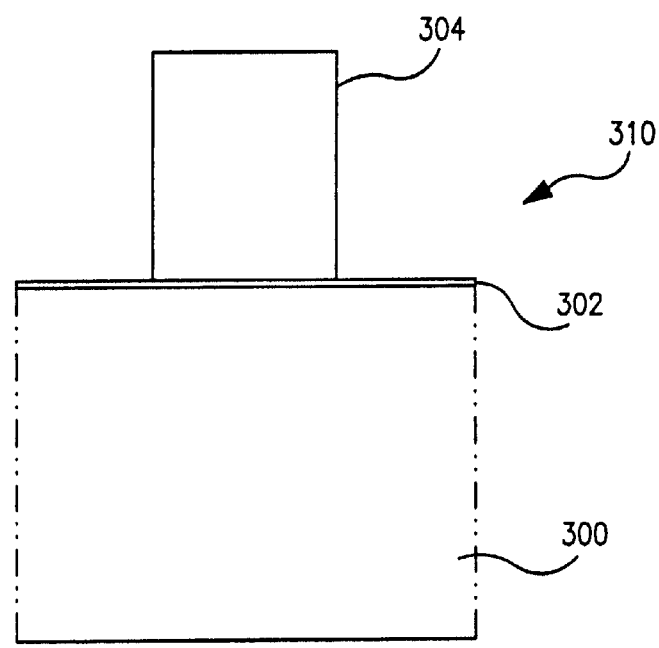
Figure 3D:
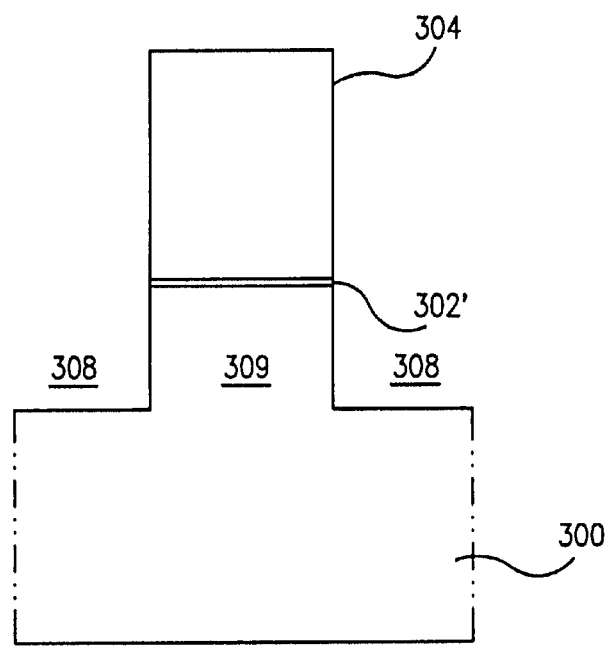
Figure 3E:
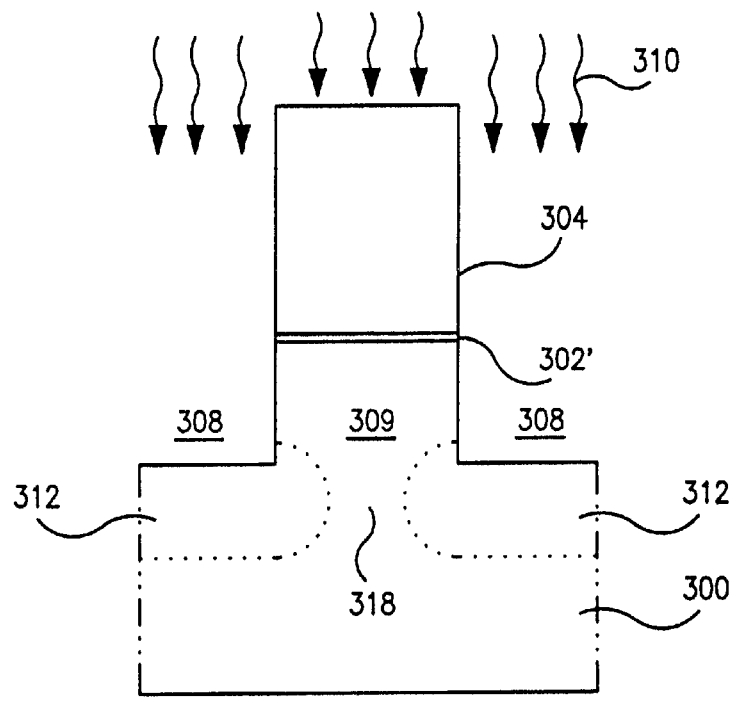
Figure 3F:
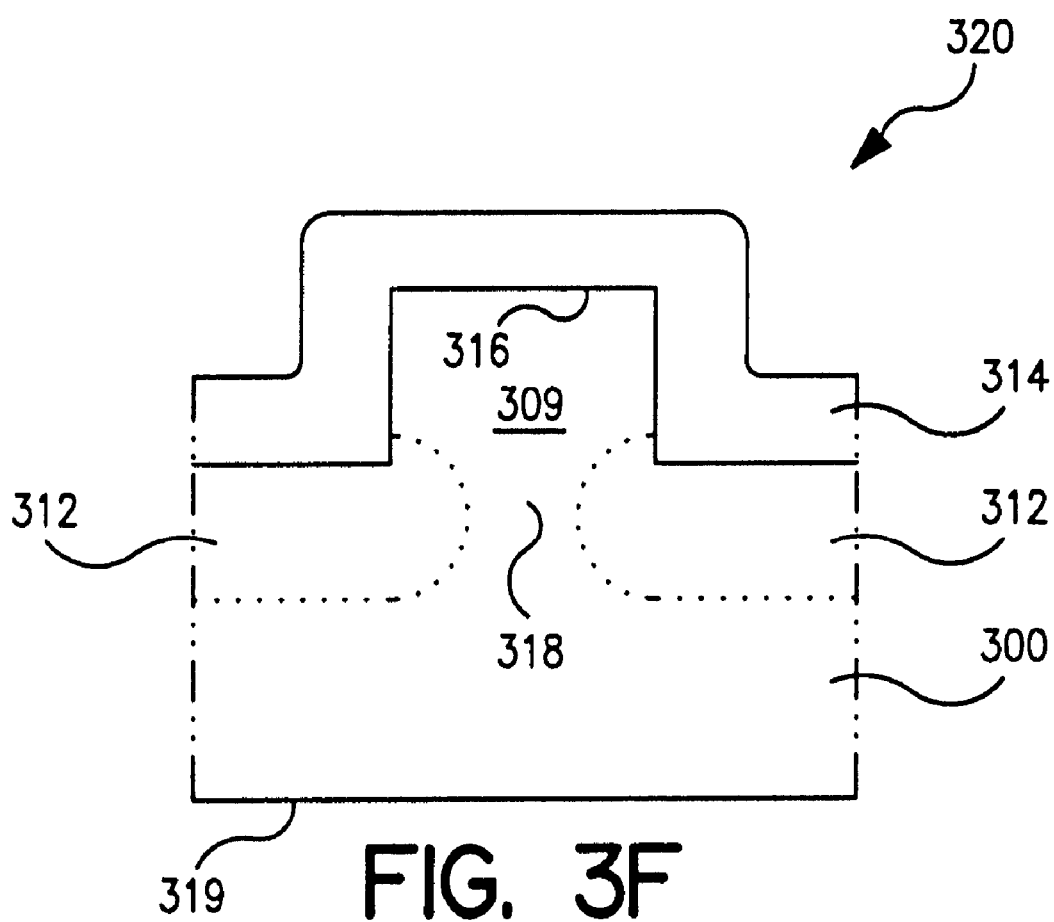

Referring now to FIG. 3C, the exploded view of region 310 of FIG. 3B is illustrated. The rectangular cylindrical construction pedestal 304 is formed on the surface of the thin oxide 302 on the substrate 300. FIGS. 3D–3F illustrate the further processing of the diode configured vertical JFED with respect to the rectangular cylindrical construction pedestal 304 of FIG. 3C. It is understood that similar processing occurs around each of the plurality of cylindrical construction pedestals 304.

Referring now to FIG. 3D, the thin oxide 302 around the pedestal 304 and a portion of the pedestal 304 and the substrate 300 have been etched away forming silicon trenches 308 and substrate pedestals 309. The silicon trenches 308 are around the cylindrical construction pedestals 304, the substrate pedestals 309, and oxide disks 302'. The oxide disks 302' are cylindrical disk shaped portions of oxide material of the thin oxide 302 which is sandwiched between the cylindrical construction pedestals 304 and the substrate pedestals 309. The substrate pedestals 309 are cylindrically shaped similar to the construction pedestals 304 but are formed out of the substrate material 300 as opposed to polysilicon material. The cylindrical substrate pedestals 309 have a cylindrical top and a cylindrical side or sides depending upon their cylindrical shape. This etch step is a Reactive Ion Etch (RIE) commonly used in silicon processing to form trench metal-oxide-semiconductor (MOS) transistors and capacitors. The depth of the etch into the substrate 300, which is not critical, is approximately 0.1 microns in one embodiment. The depth of the etch into the substrate 300 forming the depth of the silicon trenches 308, preferably corresponds to the depth of the selected energy of the Phosphorous sheet implant step previously described. The depth of the etch provides adequate threshold or pinch off control of the diode configured vertical JFED.

Referring now to FIG. 3E to illustrate the next step in the process, a boron implantation 310 is performed at the base of the substrate pedestals 309 which penetrates into the silicon substrate 300. The boron implant diffuses laterally under the substrate pedestals 309, due to scattering and rapid thermal processing (RTP) for activation, and forms a diffusion ring around a center line of the pedestals 304 and 309 referred to as a gate 312. The diffusion ring of the gate 312 has a hollow cylindrical shape which encloses a vertical channel portion 318 of the substrate 300. The vertical channel portion of the substrate 300 is cylindrically shaped around the center line of the pedestals 309 and may also be referred to as a cylindrical substrate channel. This boron implant 310 (i) provides adequate surface concentration to assure an ohmic contact to metalization; (ii) provides a P-Type surface concentration to support a breakdown voltage depletion region; and (iii) laterally diffuses to provide a JFET equivalent gate to pinch off the current flow in the vertical channel between the Anode (Top silicon surface of the pedestal formed in FIG. 3.) and the Cathode (Silicon wafer backside) during operation of each diode configured vertical JFED.

Referring now to FIG. 3F, the final steps in the process of forming the diode configured vertical JFED 320 are illustrated where the remaining portions of the pedestals 304 and the disk shaped portions of the thin oxide 302 are removed and a metalization layer 314 added. An oxide etch is used to remove the oxide forming the oxide disks 302' and undercut the pedestals 304 in order to float or lift off any of their residual polysilicon material prior to metalization. A conductive layer 314, preferably a metal, is then deposited across the wafer making contact to the exposed top surfaces of the substrate 300. The conductor 314 makes contact to the diffusion ring of the P-type gate 312 and a cylindrical top surface 316 and a cylindrical side surface or surfaces of the substrate pedestals 309. The cylindrical top surface 316 and cylindrical side surfaces of the substrate pedestals 309, but for the P-type diffusion ring of the gate, function similar to a drain or source region of a JFET. The bottom surface of the substrate 300 functions similar to a source or drain region respectively of a JFET. Note that the definition of source and drain swaps based on voltage biasing across the diode terminals. The conductor 314 contacting the diffusion ring of the gate 312 and the top surface 316 and the side surfaces of the substrate pedestals 309 provides a connection therebetween to provide the diode configuration of the diode configured vertical JFED. In the case of the substrate 300 being an N-type of silicon and the gate 312 being P-type diffusion, the top surface 316 contact forms the anode of the diode. Alternatively if the substrate 300 is P-type silicon and the gate 312 being N-type diffusion, the top surface contact 316 forms the cathode. In the diode configured vertical JFED, there is little current flow from the side surfaces of the substrate pedestals 309 so that this contact area is largely non-functional. A majority of the current flow is through the top surface 316 of the substrate pedestals 309 when forward biased. From the top surface 316, the current flows through the center vertical cylindrical channel 318 of each diode configured vertical JFED 320 in a bottom portion and towards a bottom surface 319 of the substrate 300. A metal layer may optionally be applied to the bottom surface 319 of the substrate 300 or the bottom surface 319 may otherwise make contact to a conductive surface for forming a connection of the diode through which current may flow. The diode configured vertical JFEDs 320 can also be formed in a tub of silicon (equivalent to substrate 300) within an integrated circuit substrate and a top side surface contact can be made to the tub so that the current in the bottom portion of the tub is drawn from the bottom of the channel to the top side surface contacts. Forming the vertical JFEDs in this manner allows integration with other circuitry into an integrated circuit device.

Referring now to FIGS. 4A–4I, cross-sectional views of steps to another exemplary process for fabricating the diode connected vertical junction field effect device of the present invention are illustrated. The steps of forming the diode configured vertical JFED 320 illustrated in FIGS. 4A–4I is similar to that of the steps illustrated in FIGS. 3A–3F but that steps from the masking and manufacturing techniques described in U.S. patent application Ser. No. 09/689,074 entitled "METHOD AND APPARATUS FOR PATTERN- ING FINE DIMENSIONS" filed by Richard A. Metzler on Oct. 12, 2000 are included. Particularly referring now to FIG. 4C, initial construction pedestals 404 are formed on top of the thin oxide 302. The initial construction pedestals 404 are formed of a material other that polysilicon which is used to form the second pedestals.

Figure 4A:
Figure 4B:
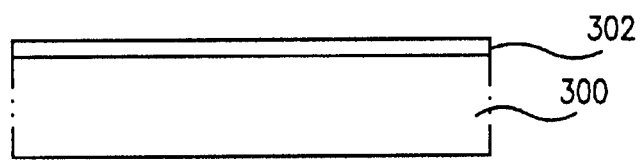
Figure 4B:
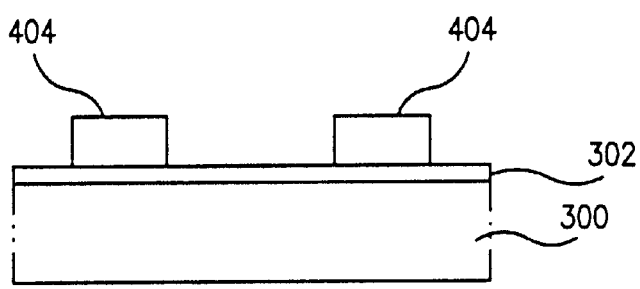
Figure 4D:
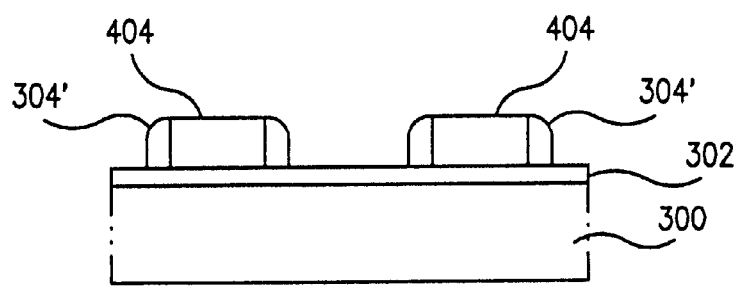

Referring now to FIG. 4D the pedestals 304', the second pedestals, are formed around the initial construction pedestals 404 as described in U.S. patent application Ser. No. 09/689,074.

Figure 4E:
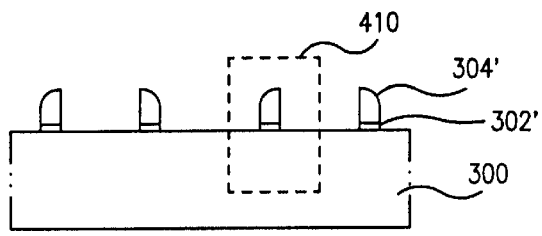
Figure 4F:
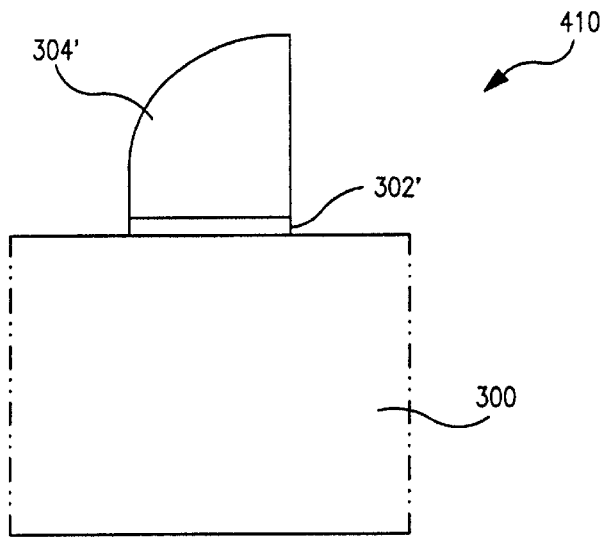

Referring now to FIG. 4E, the initial construction pedestals 404 and portions of the thin oxide 302 there-under are etched away as illustrated. The region 410 is magnified into FIG. 4F as illustrated.

Figure 4G:
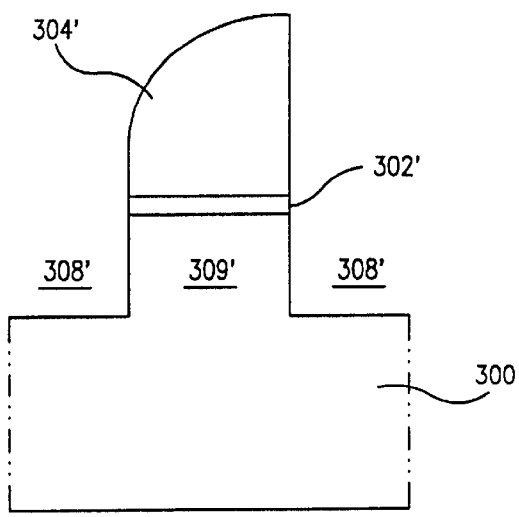
Figure 4H:
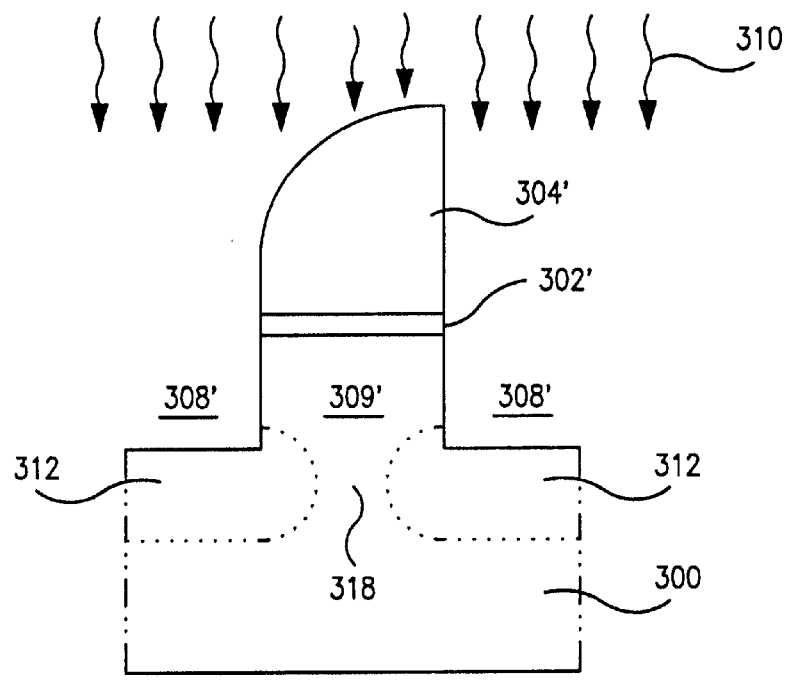
Figure 4I:
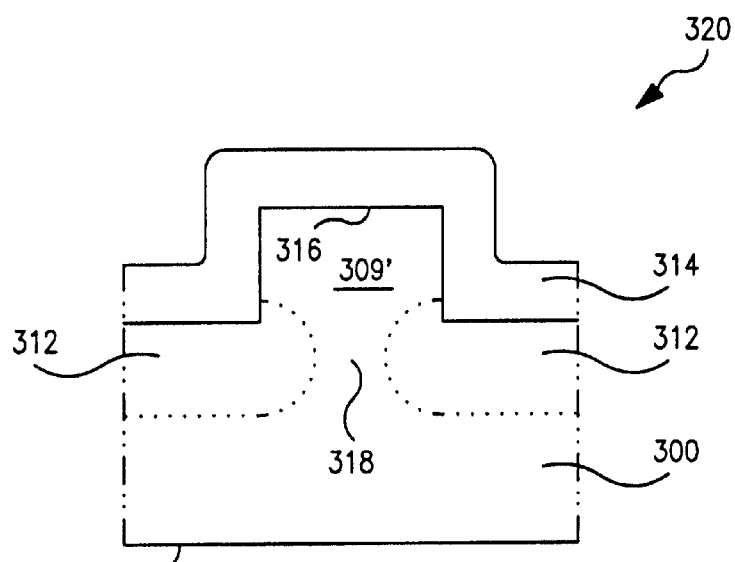

Referring now to FIG. 4G, the next step in the process is to etch away exposed portions of the substrate 300 to form the silicon trenches 308' and the substrate pedestals 309' around the pedestals 304'. The process steps illustrated by FIGS. 4H–4I are the same as those described previously with reference to FIGS. 3E–3F but with the shape of the silicon trenches 308' and the substrate pedestals 309' around the pedestals 304' in order to form the diode configured vertical JFED 320.

Figure 5:
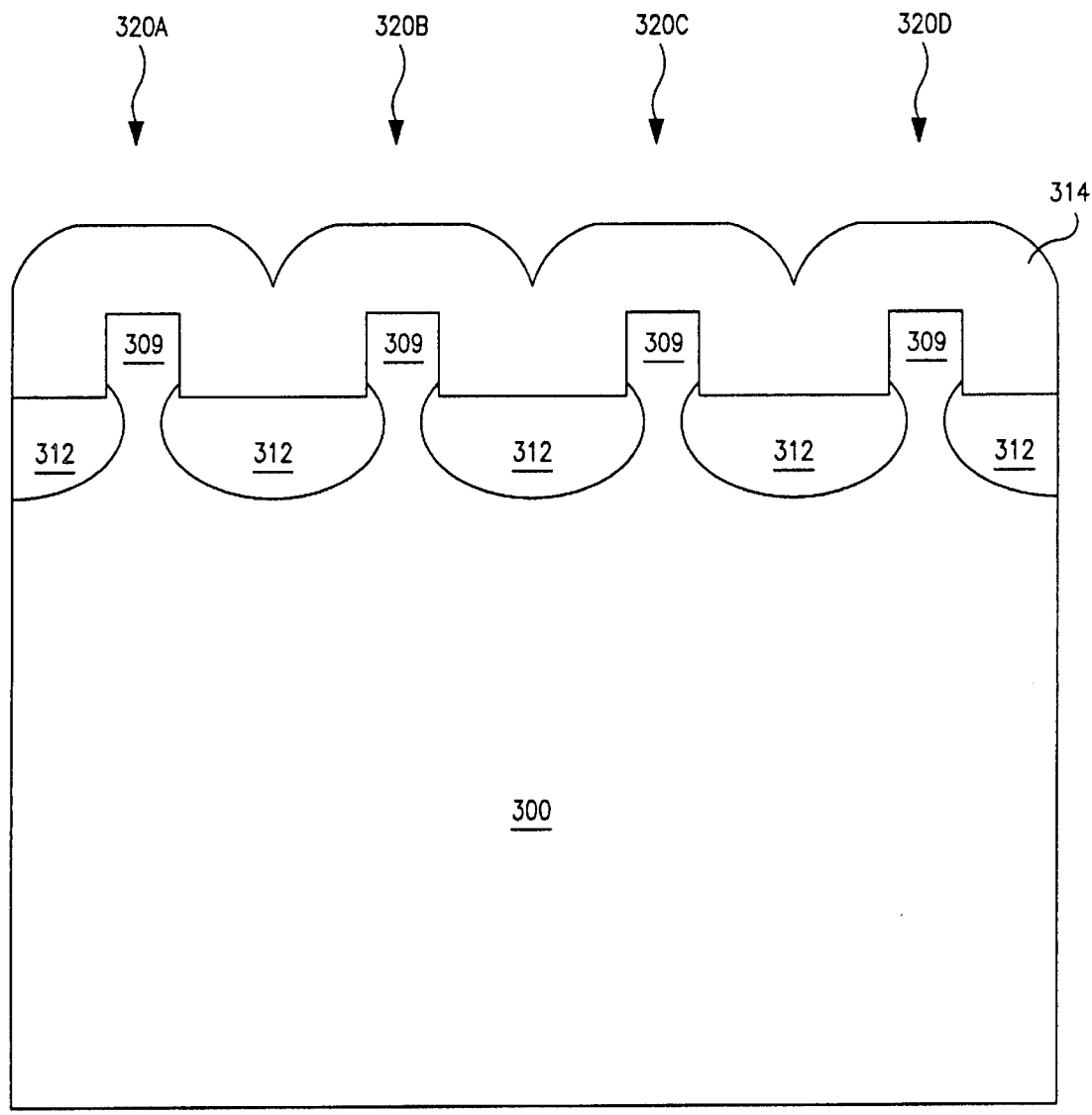
FIG. 5 is a magnified cross-sectional view illustrating four vertical JFED diode structures of the present invention.

Referring now to FIG. 5, a cross-section of a series of four diode configured vertical JFEDs 320A–D are illustrated. The metal 314 can connect a plurality of diode configured vertical JFEDs together to provide a desired current carrying capacity.

Figure 6A:
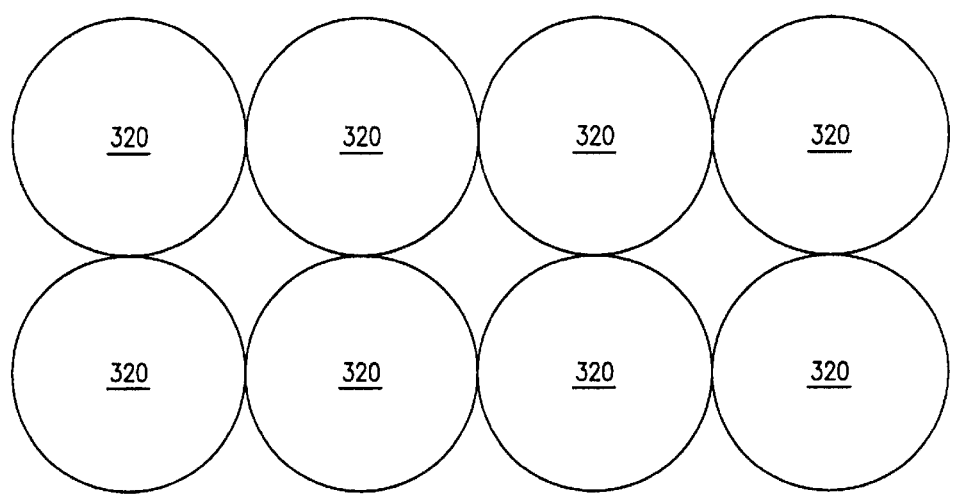
FIGS. 6A–6C are top views of alternate structures for the vertical JFED diode of the present invention.
Figure 6B:
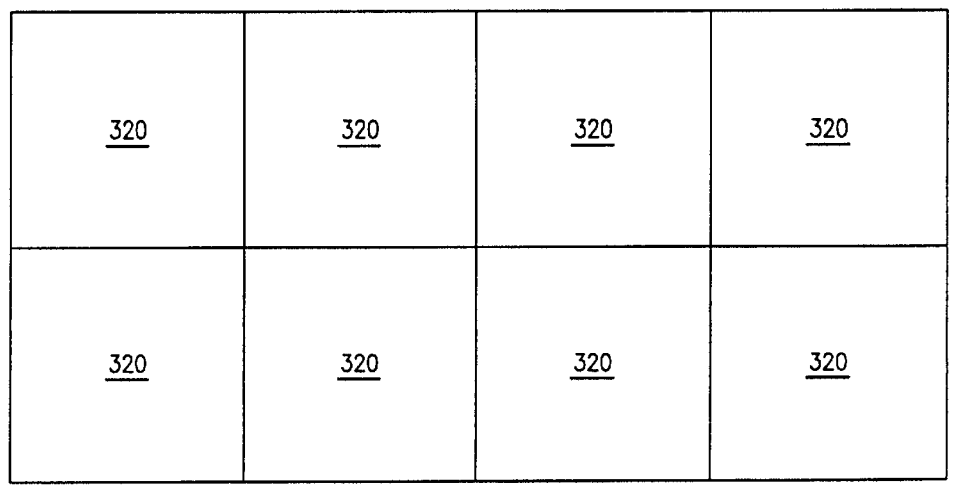
Figure 6C:
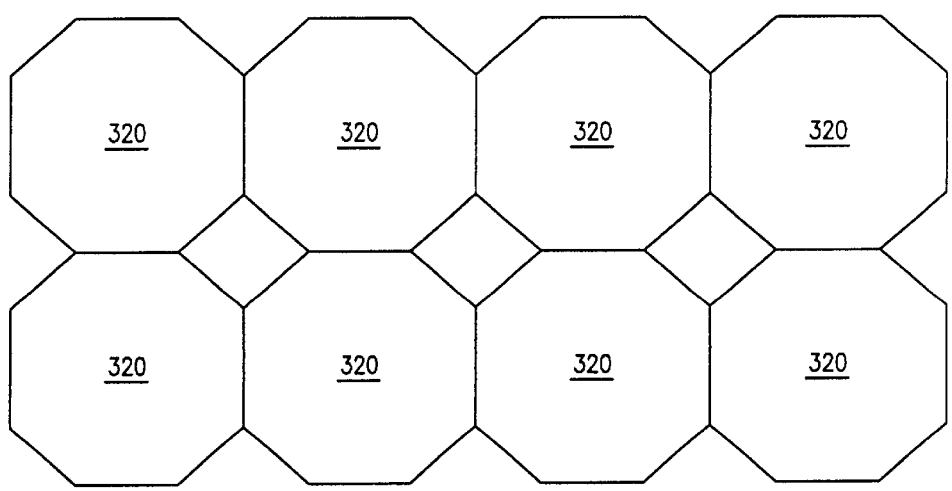

Referring now to FIGS. 6A–6C, top views of exemplary arrays of diode configured vertical JFEDs are illustrated. In FIG. 6A, the diode configured vertical JFEDs 320 are formed using circular cylindrical pedestals. In FIG. 6B, the diode configured vertical JFEDs 320 are formed using rectangular of square cylindrical pedestals. In FIG. 6C, the diode configured vertical JFEDs 320 are formed using hexagonal cylindrical pedestals. Other cylindrical shapes can be used for the pedestals 304 and 304' in order to form different shapes of the diode configured vertical JFEDs 320.

Figure 7A:
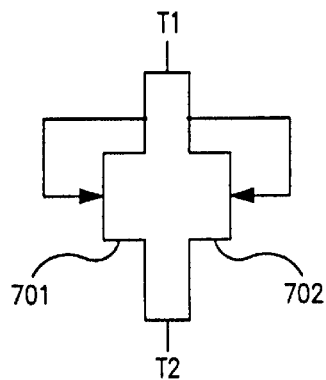
FIGS. 7A–7B illustrate schematic equivalent circuits for a two dimensional model of an N-channel vertical JFED diode.
Figure 7B:
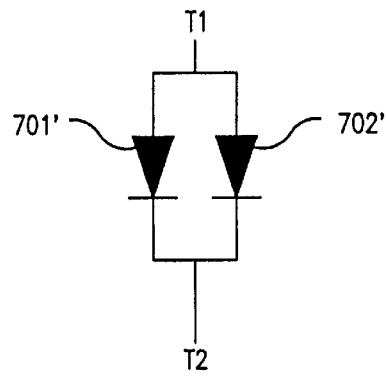
Figure 7C:
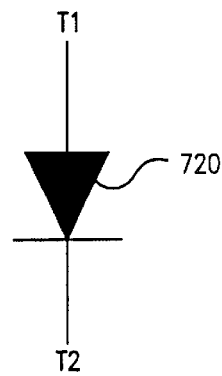
FIG. 7C illustrates the schematic equivalent circuit for a three dimensional model of the N-channel vertical JFED diode.

The process steps in FIGS. 3A–3F and 4A–4I are described as where the diffusion ring of the gate 312 is P+type diffusion and substrate 300 is an N type of substrate. In this case, FIG. 7A illustrates the equivalent circuit of the two dimensional cross section of the diode configured vertical JFED 320. The cross-section is represented by transistors 701 and 702, each representing one vertical transistor, and are n channel JFET transistors with the first terminal, T1, being the anode and the second terminal, T2, being the cathode. FIG. 7B illustrates the diode equivalent of the two dimensional circuit of FIG. 7A where two diodes 701' and 702' are connected in parallel together. FIG. 7C illustrates the electrical equivalent, a single diode 720, of the three dimensional diode configured vertical JFED 320.

Figure 8A:
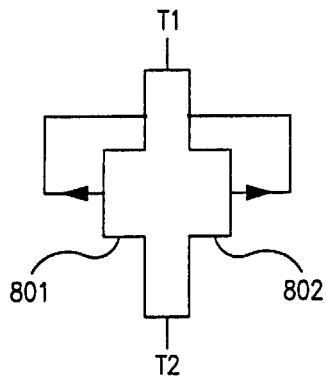
FIGS. 8A–8B illustrate schematic equivalent circuits for a two dimensional model of an P-channel vertical JFED diode.
Figure 8B:
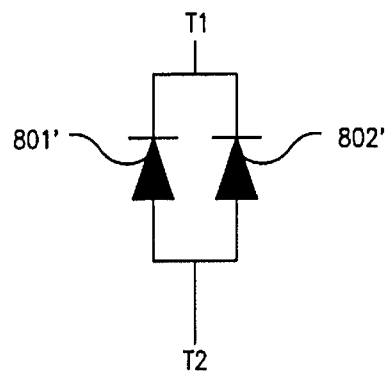
Figure 8C:
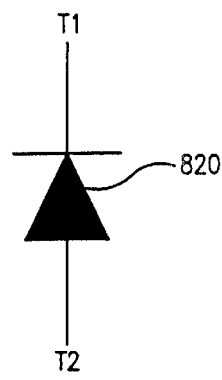
FIG. 8C illustrates the schematic equivalent circuit for a three dimensional model of the P-channel vertical JFED diode.

While the process steps in FIGS. 3A–3F and 4A–4I are described as where the diffusion ring of the gate 312 is P+ type diffusion and substrate 300 is an N type of substrate, they may be altered by using different starting materials and different implant or dopant materials. In this case the diffusion types are reversed from n to p and from p to n in the process steps previously described. FIG. 8A illustrates the equivalent circuit of the two dimensional cross section of the diode configured vertical JFED 320 illustrated in FIG. 3F with reversed type of silicon diffusion and materials. In this case, the diffusion ring of the gate 312 is N+ type diffusion and substrate 300 is a P type of substrate. In FIG. 8A, the transistors 801 and 802, each representing one vertical transistor, are p channel JFET transistors and the first terminal, T1, is the cathode and the second terminal, T2, is the anode. FIG. 8B illustrates the diode equivalent of the two dimensional circuit of FIG. 8A where two diodes 801' and 802' are connected in parallel together. FIG. 8C illustrates the electrical equivalent, a single diode 820, of the three dimensional diode configured vertical JFED with altered material types.

Figure 9:
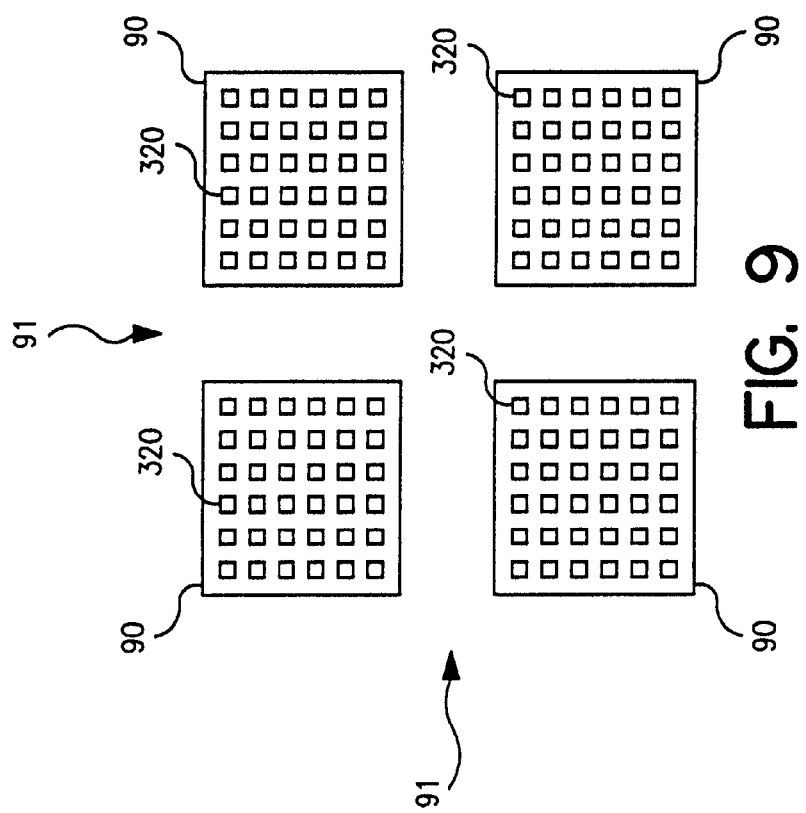
FIG. 9 illustrates active diode areas on a wafer employing a plurality of vertical JFED diodes.

Referring now to FIG. 9, a plurality of diode active areas 90 are separated by scribe channels 91 between the diode active areas 90 on the wafer. In each diode active area 90 are a plurality of diode configured vertical JFEDs 320. Edge termination of the diode active areas in the scribe channels 91 can be provided through several semiconductor device terminations including the tapered termination of U.S. Pat. No. 5,825,079 entitled "Semiconductor diodes having low forward conduction voltage drop and low reverse current leakage" filed by Richard A. Metzler and Vladimir Rodov on Jan. 23, 1997 or the mesa termination described in U.S. patent application Ser. No. 09/395,722 entitled "Method and Apparatus for Termination of Semiconductor Devices" filed by Richard Metzler on Sep. 14, 1999. Additionally, single or multiple normal ring terminations which are well known can be used; or, voltage permitting, a simple guard ring integral with the device active diffusions can be used.

Figure 10:
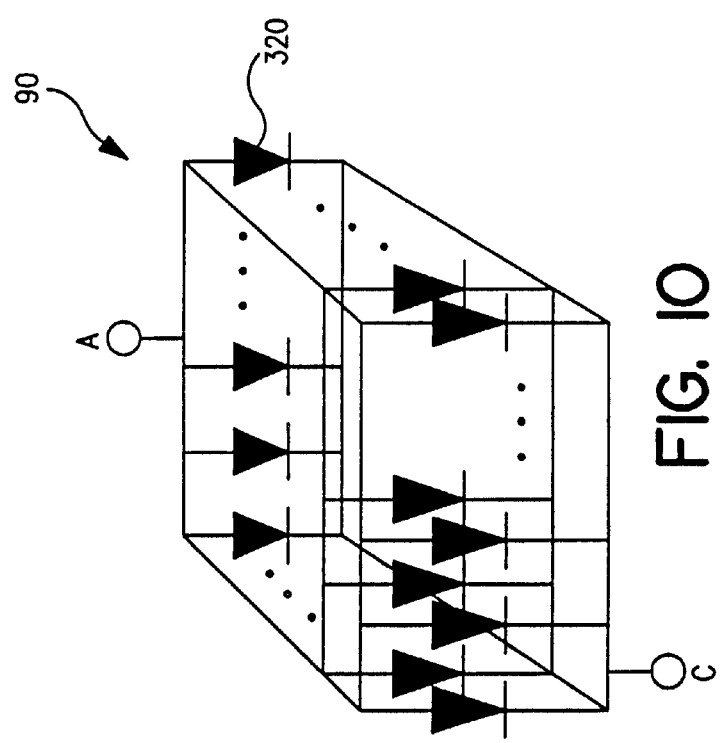
FIG. 10 is a schematic diagram of the electrical equivalent of one active diode area.

Referring now to FIG. 10, the schematic equivalent of the diode active area 90 having multiple diodes 720, each representing a diode configured vertical JFED 320, connected in parallel together. Adding the current capability of each of the diode configured vertical JFED devices 320 connected in parallel together results in a large current carrying capability. It is understood that there are several hundred diode active areas 90 on a wafer, with only four being shown in FIG. 9. Each individual diode active area 90 can contain thousands of individual diode configured vertical JFEDs 320.

With respect to the current capability of the diode, the forward current is a function of the number of diode configured vertical JFEDs 320 which are coupled in parallel together.

With respect to the threshold voltage, by appropriately selecting the dopants, their concentrations, and other materials and dimensions for fabrication of the diode configured vertical JFED, the channel regions may be made to just conduct at substantially zero forward bias across the anode and cathode. Thus, in true rectifying applications such as in power supplies and the like, the present invention results in reduced power consumption and heating in the rectifying devices, and greater overall efficiency of the resulting circuits.

With respect to the reverse bias breakdown voltage of the diode configured vertical JFED 320, a reverse bias voltage appears between the gate 312 and the substrate 300 causing the channel 318 to be pinched off and a depletion region to form in the substrate 300. The electric field lines of the reverse bias voltage are substantially planar around the diode configured vertical JFED due to the longitudinal shape of the diffusion for the gate 312 and the very small dimensions of the pedestals. This planar field effect increases the reverse breakdown voltage capability. To increase the reverse bias breakdown voltage further, it is desirable to keep the electric field lines straight and parallel with little crowding at pn junctions and having a minimal amount of curvature near electric field termination points such as at device termination near the scribe lines 91.

In certain instances in the foregoing description, certain alternate materials and methods were set forth. It is to be noted however, that the identification of specific alternative materials and processes is not to infer that still other materials and processes for those or other steps in the process of fabrication or in the resulting diode devices are excluded from use in the present invention. To the contrary, steps and materials other than those set out herein will be obvious to those skilled in the art. Thus while the present invention has been disclosed and described with respect to certain preferred embodiments, it will be understood to those skilled in the art that the present invention diodes and methods of fabricating the same may be varied without departing from the spirit and scope of the invention.

What is claimed is:

1. A diode comprising:
    a cylindrical vertical junction field effect device (JFED) in a diode configuration including,
        a substrate of a first conductivity type having a bottom surface and a top surface including a cylindrical pedestal having a cylindrical side and a cylindrical top surface,
        a ring shaped diffusion region of a second conductivity type at the base of the cylindrical pedestal around a center line of the cylindrical pedestal, and
        a first conductive layer on the top surface of the cylindrical pedestal coupling together the ring shaped diffusion region and the cylindrical top surface.

2. The diode of claim 1, wherein,
    the substrate is an n-type silicon and the bottom surface forms a cathode of the diode, and
    the ring shaped diffusion region is a p-type diffusion and the first conductive layer is an anode of the diode.

3. The diode of claim 1, wherein,
    the substrate is a p-type silicon and the bottom surface forms an anode of the diode, and
    the ring shaped diffusion region is an n-type diffusion and the first conductive layer is a cathode of the diode.

4. The diode of claim 1, wherein,
    the ring shaped diffusion region forms a gate around a channel in the substrate.

5. The diode of claim 4, wherein,
    the gate is a cylindrical gate around the channel.

6. The diode of claim 5, wherein,
    the cylindrical top surface is a source/drain of the cylindrical vertical junction field effect device, and
    the cylindrical gate is coupled to the source/drain to provide the diode configuration.

7. The diode of claim 1, wherein,
    the first conductive layer is metal.

8. The diode of claim 1, wherein,
    the first conductive layer forms a first terminal of the diode and
    the cylindrical vertical junction field effect device (JFED) further includes,
        a second conductive layer coupled to the bottom surface of the substrate, the second conductive layer to form a second terminal of the diode.

9. A diode device providing a one way electrical valve between an anode terminal and a cathode terminal, the diode device comprising:
    one or more diode active regions having anodes coupled in parallel together for the anode terminal and cathodes coupled in parallel together for the cathode terminal, each diode active region including,
        a plurality of diode connected vertical cylindrical junction field effect devices, each including
            a substrate having a top surface and a bottom surface with a cylindrical pedestal extending from the top surface,
            a diffusion ring in the substrate at a base of the cylindrical pedestal forming a cylindrical substrate channel between the top surface and the bottom surface of the substrate, and,
            a conductive layer coupling the cylindrical pedestal and the diffusion ring together; and,
    a device termination around each of the one or more diode active regions to terminate each diode active region.

10. The diode device of claim 9, wherein,
    the substrate is an n-type silicon and the bottom surface forms a cathode of the diode device, and
    the diffusion ring is a p-type diffusion and the conductive layer is an anode of the diode.

11. The diode device of claim 9, wherein,
    the substrate is a p-type silicon and the bottom surface forms an anode of the diode device, and
    the diffusion ring is an n-type diffusion and the conductive layer is a cathode of the diode.

12. A method of manufacturing a diode device having a first terminal and a second terminal, the method comprising:
    providing a substrate and forming a plurality of cylindrical substrate pedestals out of a top surface of the substrate;
    forming rings of diffusion around a centerline and at a base of the cylindrical substrate pedestals; and
    forming a metal layer on the top surface of the substrate to connect the cylindrical substrate pedestals and the rings of diffusion together.

13. The method of manufacturing a diode device of claim 12, wherein,
    the forming of the plurality of cylindrical substrate pedestals out of the top surface of the substrate includes
    etching a plurality of trenches into the substrate around a plurality of cylindrical construction pedestals.

14. The method of manufacturing a diode device of claim 13, wherein,
    the plurality of cylindrical construction pedestals are formed on a thin oxide on the top surface of the substrate by depositing a layer of polysilicon and etching away portions there-from leaving the plurality of cylindrical construction pedestals intact.

15. The method of manufacturing a diode device of claim 12, wherein,
    the rings of diffusion surround cylindrical substrate channels in the centerline of the cylindrical substrate pedestals.

16. The method of manufacturing a diode device of claim 12, wherein,
    the rings of diffusion are formed by implanting dopants into the top surface of the substrate at the base of the cylindrical substrate pedestals.

17. The method of manufacturing a diode device of claim 16, wherein,
    the rings of diffusion diffuse laterally due to scattering and rapid thermal processing for activation.

18. The method of manufacturing a diode device of claim 12, wherein,
    the rings of diffusion are formed by diffusing dopants into the top surface of the substrate at the base of the cylindrical substrate pedestals.

19. The method of manufacturing a diode device of claim 12, wherein,
the top surface of the substrate are sources/drains, the rings of diffusion are gates, and the bottom surface of the substrate are drains/sources of a plurality of diode configured vertical cylindrical junction field effect devices.

20. The method of manufacturing a diode device of claim 12, wherein,
the substrate is n-type silicon and the dopants are p-type dopants forming p-type rings of diffusion.

21. The method of manufacturing a diode device of claim 20, wherein,
the bottom surface of the silicon substrate is a cathode and the metal layer is an anode of the diode device.

22. The method of manufacturing a diode device of claim 12, wherein,
the substrate is p-type silicon and the dopants are n-type dopants forming n-type rings of diffusion.

23. The method of manufacturing a diode device of claim 22, wherein,
the bottom surface of the substrate is an anode and the metal layer is a cathode of the diode device.

24. A method of manufacturing a diode device having a first terminal and a second terminal in an integrated circuit, the method comprising:
forming a tub into a substrate of the integrated circuit;
forming a plurality of cylindrical pedestals out of a top surface of the tub;
forming rings of diffusion around a centerline and at a base of the cylindrical pedestals; and
forming a first metal connection to connect the cylindrical pedestals and the rings of diffusion together as the first terminal.

25. The method of manufacturing a diode device of claim 24, further comprising:
forming a second metal connection to connect to a bottom portion of the tub on the top surface as the second terminal.

26. The method of manufacturing a diode device of claim 24, wherein,
the forming of the plurality of cylindrical pedestals out of the top surface of the tub includes
etching a plurality of trenches into the tub around a plurality of cylindrical construction pedestals.

27. The method of manufacturing a diode device of claim 24, wherein,
the plurality of cylindrical construction pedestals are formed on a thin oxide on the top surface of the tub by depositing a layer of polysilicon and etching away portions there-from leaving the plurality of cylindrical construction pedestals intact.

28. The method of manufacturing a diode device of claim 24, wherein,
the rings of diffusion surround cylindrical channels in the centerline of the cylindrical pedestals.

29. The method of manufacturing a diode device of claim 24, wherein,
the rings of diffusion are formed by implanting dopants into the top surface of the tub at the base of the cylindrical pedestals.

30. The method of manufacturing a diode device of claim 29, wherein,
the rings of diffusion diffuse laterally due to scattering and rapid thermal processing for activation.

31. The method of manufacturing a diode device of claim 24, wherein,
the rings of diffusion are formed by diffusing dopants into the top surface of the tub at the base of the cylindrical pedestals.

32. A diode in an integrated circuit substrate comprising:
a cylindrical vertical junction field effect device (JFED) in a diode configuration including,
a tub of a first conductivity type having a bottom portion and a top surface including a cylindrical pedestal having a cylindrical side and a cylindrical top surface,
a ring shaped diffusion region of a second conductivity type at the base of the cylindrical pedestal around a center line of the cylindrical pedestal, and
a first connection on the top surface of the cylindrical pedestal coupling together the ring shaped diffusion region and the cylindrical top surface.

33. The diode of claim 32, wherein,
the cylindrical vertical junction field effect device (JFED) further includes
a second connection to couple to the bottom portion of the tub in its top surface.

34. The diode of claim 33, wherein,
the tub is an n-type silicon and the second connection is a cathode of the diode, and
the ring shaped diffusion region is a p-type diffusion and the first connection is an anode of the diode.

35. The diode of claim 33, wherein,
the tub is a p-type silicon and the second connection is an anode of the diode, and
the ring shaped diffusion region is an n-type diffusion and the first connection is a cathode of the diode.

36. The diode of claim 32, wherein,
the ring shaped diffusion region forms a gate around a channel in the tub.

37. The diode of claim 36, wherein,
the gate is a cylindrical gate around the channel.

38. The diode of claim 37, wherein,
the cylindrical top surface is a source/drain of the cylindrical vertical junction field effect device, and
the cylindrical gate is coupled to the source/drain to provide the diode configuration.

39. The diode of claim 32, wherein,
the first connection is metal.

\* \* \* \* \*